United States Patent
Han et al.

(10) Patent No.: US 11,282,907 B2
(45) Date of Patent: Mar. 22, 2022

(54) DISPLAY SUBSTRATE AND DISPLAY PANEL

(71) Applicant: BOE TECHNOLOGY GROUP CO., LTD., Beijing (CN)

(72) Inventors: Ying Han, Beijing (CN); Yicheng Lin, Beijing (CN); Pan Xu, Beijing (CN); Ling Wang, Beijing (CN); Guoying Wang, Beijing (CN); Xing Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/884,461

(22) Filed: May 27, 2020

(65) Prior Publication Data

US 2021/0134903 A1    May 6, 2021

(30) Foreign Application Priority Data

Oct. 30, 2019   (CN) .......................... 201911047646.4

(51) Int. Cl.
  *H01L 27/32* (2006.01)
  *H01L 51/50* (2006.01)
  *H01L 51/52* (2006.01)

(52) U.S. Cl.
  CPC ...... *H01L 27/3246* (2013.01); *H01L 27/3272* (2013.01); *H01L 51/502* (2013.01);
  (Continued)

(58) Field of Classification Search
  CPC ............. H01L 27/3246; H01L 27/3272; H01L 51/5218; H01L 51/5268; H01L 51/5271
  See application file for complete search history.

(56) References Cited

U.S. PATENT DOCUMENTS

| 6,801,281 B2 | 10/2004 | Huang et al. |
| 7,580,092 B2 | 8/2009 | Heo |

(Continued)

FOREIGN PATENT DOCUMENTS

| CN | 1892389 A | 1/2007 |
| CN | 1991487 A | 7/2007 |

(Continued)

OTHER PUBLICATIONS

First Office Action, including Search Report, for Chinese Patent Application No. 201911047646.4, dated Jun. 30, 2021, 27 pages.

(Continued)

*Primary Examiner* — Anthony Ho
(74) *Attorney, Agent, or Firm* — Westman, Champlin & Koehler, P.A.

(57) ABSTRACT

The pixel substrate and a pixel panel are provided. The display substrate includes: a display structure layer, a cover plate on the display structure layer and a plurality of pixel definition layers and an anti-light crosstalk layer between the display structure layer and the cover plate, where the pixel definition layers are arranged on a lower surface of the cover plate at intervals and are in a one-to-one correspondence to sub-pixel units of the display substrate, the anti-light crosstalk layer surrounds each pixel definition layer, where a reflective component is between the anti-light crosstalk layer and the display structure layer, the reflective component includes an inclined surface configured to reflect light from the display structure layer to the pixel definition layer.

19 Claims, 6 Drawing Sheets

(52) U.S. Cl.
CPC ...... *H01L 51/5218* (2013.01); *H01L 51/5234* (2013.01); *H01L 51/5268* (2013.01); *H01L 51/5271* (2013.01); *H01L 51/5284* (2013.01); H01L 2251/308 (2013.01)

(56) References Cited

U.S. PATENT DOCUMENTS

| | | |
|---|---|---|
| 9,960,377 B2 | 5/2018 | Jia et al. |
| 10,739,632 B2 | 8/2020 | Chien |
| 11,018,323 B2 | 5/2021 | Lee et al. |
| 2007/0008464 A1 | 1/2007 | Yamaguchi |
| 2007/0146582 A1 | 6/2007 | Heo |
| 2017/0125740 A1 | 5/2017 | Lee et al. |
| 2017/0294614 A1 | 10/2017 | Jia et al. |
| 2019/0243182 A1 | 8/2019 | Chien |
| 2021/0011340 A1 | 1/2021 | Zhao |

FOREIGN PATENT DOCUMENTS

| | | |
|---|---|---|
| CN | 101556397 A | 10/2009 |
| CN | 105765450 A | 7/2016 |
| CN | 105974648 A | 9/2016 |
| CN | 106647001 A | 5/2017 |
| CN | 106653800 A | 5/2017 |
| CN | 109283734 A | 1/2019 |
| CN | 110211997 A | 9/2019 |
| CN | 110320702 A | 10/2019 |
| WO | 2012042803 A1 | 4/2012 |

OTHER PUBLICATIONS

Second Office Action, including Search Report, for Chinese Patent Application No. 201911047646.4, dated Dec. 2, 2021, 23 pages.

DISPLAY SUBSTRATE AND DISPLAY PANEL

CROSS-REFERENCE TO RELATED APPLICATION

The present application claims a priority to Chinese Patent Application No. 201911047646.4 filed in China on Oct. 30, 2019, the disclosure of which is incorporated herein in its entirety by reference.

TECHNICAL FIELD

The present disclosure relates to the field of display technology, in particular to a pixel substrate and a pixel panel.

BACKGROUND

At present, the technologies under development for large-size display products mainly include QD-OLED, IJP OLED, QDCF-LCD and other technologies, of which QD-OLED has high resolution, high color gamut, no viewing angle dependence, and can be applied to large and medium-sized high-color gamut and high-resolution products.

In the design of the QD-OLED display panel in the related art, due to the low conversion efficiency of QD (quantum dot) and the efficiency of the blue light emitting layer is low, then the resultant current efficiency of the red pixel and green pixel are low, and the blue pixel needs to pass the scattering particle layer and the blue color film, then the resultant current efficiency of the blue pixel is also low. The low current efficiency of the pixel will make the final pixel current to be high, resulting in a large overall current of the display panel, increased driving voltage and increased power consumption.

Therefore, how to improve the current efficiency in the display panel is a problem to be solved in the art.

SUMMARY

In a first aspect, a display substrate is provided in the present disclosure, including: a display structure layer, a cover plate on the display structure layer and a plurality of pixel definition layers and an anti-light crosstalk layer between the display structure layer and the cover plate, where the pixel definition layers are arranged on a lower surface of the cover plate at intervals and are in a one-to-one correspondence to sub-pixel units of the display substrate, the anti-light crosstalk layer surrounds each pixel definition layer, where a reflective component is between the anti-light crosstalk layer and the display structure layer, the reflective component includes an inclined surface configured to reflect light from the display structure layer to the pixel definition layer.

Optionally, the reflective component includes a reflective layer, and the inclined surface is at a side of the reflective layer close to the display structure layer, and an end of the inclined surface is connected to the pixel definition layer, and the other end of the inclined surface extends obliquely toward the display structure layer.

Optionally, the reflective component includes a reflective layer and an inclined layer, the inclined layer is between the anti-light crosstalk layer and the reflective layer, and a thickness of the inclined layer increases gradually from an end of the inclined layer close to the display structure layer to an end of the inclined layer away from the display structure layer, an included angle $\theta$ is formed between a lower surface of the inclined layer and a plane of the anti-light crosstalk layer;

the reflective layer is on the lower surface of the inclined layer, to make a surface of the reflective layer close to the display structure layer to form the inclined surface.

Optionally, a value range of the included angle $\theta$ is $c/b*[1-(a+b)/(a+2b)]<\tan \eta <90°$ C., where a width of the pixel definition layer is a, a width of an orthographic projection of a light emitting region of the display structure layer onto the inclined layer is b, and a distance from the pixel definition layer to the display structure layer is c.

Optionally, a material of the inclined layer is an organic material.

Optionally, the display substrate further includes a photoresist under the anti-light crosstalk layer, and an additional reflective layer covers a surface of the photoresist.

Optionally, a material of the reflective layer is Al, Mo or ITO-Ag-ITO alloy.

Optionally, the anti-light crosstalk layer is a partition wall.

Optionally, the sub-pixel units of the display substrate include a green sub-pixel unit, a red sub-pixel unit and a blue sub-pixel unit, and the pixel definition layers include a green quantum dot layer, a red quantum dot layer and a blue scattering particle layer, the green quantum dot layer, the red quantum dot layer and the blue scattering particle layer are arranged on the lower surface of the cover plate at intervals, and the green quantum dot layer corresponds to the green sub-pixel unit, the red quantum dot layer corresponds to the red sub-pixel unit, and the blue scattering particle layer corresponds to the blue sub-pixel unit.

Optionally, the display substrate further includes a photoresist under the anti-light crosstalk layer, and an additional reflective layer covers a surface of the photoresist.

Optionally, a material of the reflective layer is Al, Mo or ITO-Ag-ITO alloy.

Optionally, a first end of the reflective layer close to the pixel definition layer is closer to the cover plate than a second end of the reflective layer away from the pixel definition layer.

Optionally, a cross sectional area of the reflective layer in a direction parallel with the cover plate decreases gradually along a direction from the cover plate to the display structure layer.

Optionally, a first end of the reflective layer close to the pixel definition layer is closer to the cover plate than a second end of the reflective layer away from the pixel definition layer.

Optionally, an orthographic projection of an end of the additional reflective layer away from the pixel definition layer onto the cover plate is outside an orthographic projection of the pixel definition layer onto the cover plate.

Optionally, the display structure layer includes a light-emitting component, the light-emitting component includes a reflective electrode configured to reflect, to the pixel definition layer, light which is from the display structure layer and reflected by the inclined surface.

Optionally, the display structure layer further includes a transparent electrode closer to the reflective layer than the reflective electrode.

Optionally, the display substrate further includes a base at a side of the display structure layer away from the cover plate, and the display structure layer further includes a thin film transistor;

a light-shielding layer is at a side of the base close to the cover plate, and a position of the light-shielding layer corresponds to a position of the thin film transistor.

In a second aspect, a display panel including a display substrate hereinabove is further provided in the present disclosure.

BRIEF DESCRIPTION OF THE DRAWINGS

-FIG. 5(e) is a flow chart of a method of forming an inclined layer of the display substrate shown in FIG. 3.

DETAILED DESCRIPTION

Embodiments will be described in detail here, examples of which are shown in the drawings. When referring to the drawings below, unless otherwise indicated, the same numerals in different drawings represent the same or similar elements. The embodiments described in the following exemplary embodiments do not represent all embodiments consistent with the present disclosure. Rather, they are merely examples of devices consistent with some aspects of the present disclosure as detailed in the appended claims.

The terminology used in the present disclosure is for the purpose of describing particular embodiments only, and is not intended to limit the present disclosure. Unless otherwise defined, the technical or scientific terms used in the present disclosure shall have the usual meanings understood by those with general skills in the field to which the present disclosure belongs. The words "a" or "an" and the like used in the specification and claims of the present disclosure do not mean a quantity limit, but mean that there is at least one. Similar words such as "include" or "including" mean that the elements or objects before "include" or "including" cover the elements or objects listed after "include" or "including" and their equivalents, and do not exclude other elements Or objects. "Connected" or "connected" and similar words are not limited to physical or mechanical connections, and may include electrical connections, whether direct or indirect. "multiple" includes two, equivalent to at least two. The singular forms "a", "said" and "the" used in the specification of the present disclosure and the appended claims are also intended to include most forms unless the context clearly indicates other meanings. It should also be understood that the term "and/or" as used herein refers to and includes any or all possible combinations of one or more associated listed items.

Figure 1:
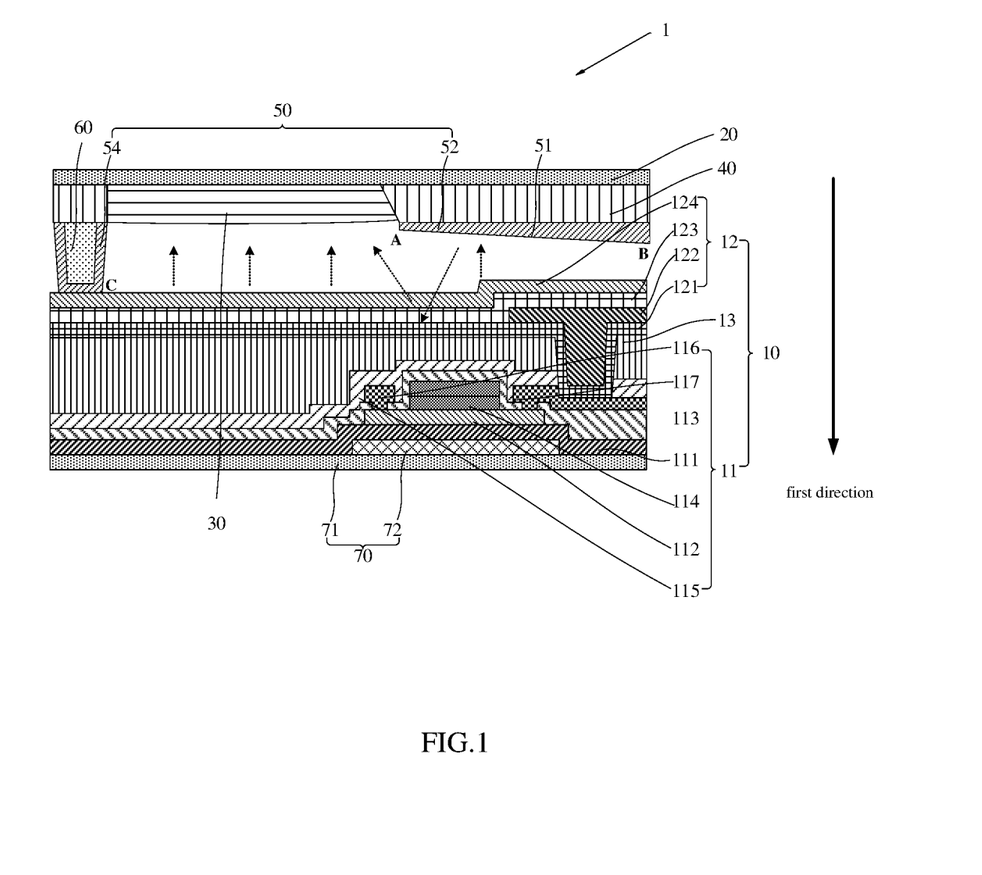
FIG. 1 is a cross-sectional view of a display substrate in some embodiments of the present disclosure.
Figure 2:
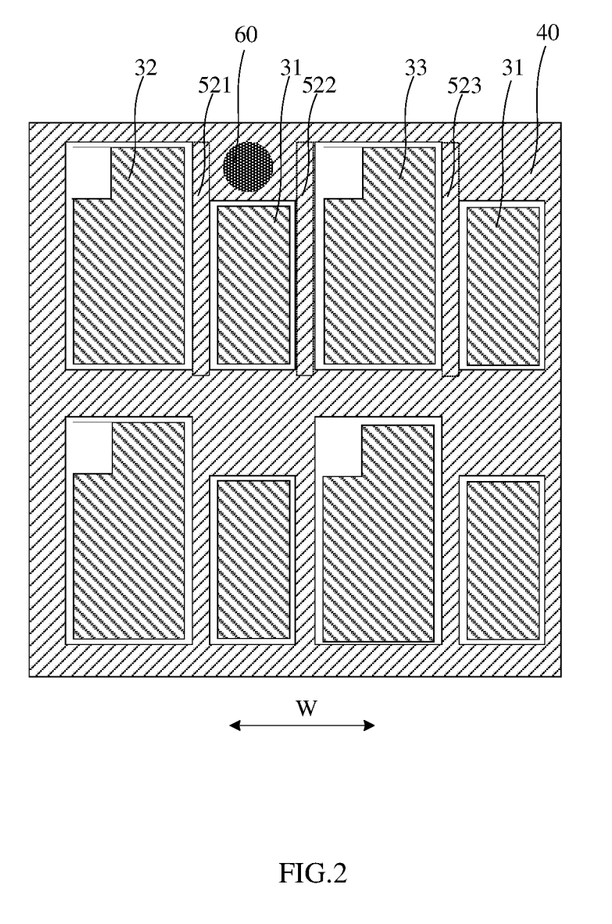
FIG. 2 is a top view of a display substrate in some embodiments of the present disclosure.

Referring to FIG. 1 and FIG. 2, a display substrate and a display panel including the display substrate are provided in some embodiments of the present disclosure.

The display substrate 1 includes a display structure layer 10, a cover plate 20 on the display structure layer 10 and a plurality of pixel definition layers 30 and an anti-light crosstalk layer 40 between the display structure layer and the cover plate, where the pixel definition layers 30 are arranged on a lower surface of the cover plate 20 at intervals and are in a one-to-one correspondence to sub-pixel units of the display substrate 1, the anti-light crosstalk layer 40 surrounds each pixel definition layer 30, where a reflective component 50 is between the anti-light crosstalk layer 40 and the display structure layer 10, the reflective component 50 includes an inclined surface 51 configured to reflect light from the display structure layer 10 to the pixel definition layer 50.

In this way, by the reflecting member 50 with the inclined surface 51, the light emitted by the display structure layer 10 that was absorbed by the anti-light crosstalk layer 40 may be reflected, and after the light is reflected to the display structure layer 10, the light may be reflected by the display structure layer 10 again to the pixel definition layer 30, which may greatly improve the utilization efficiency of the light emitted by the display structure layer 10, thereby greatly improving the overall current efficiency. In FIG. 1, the transmission path and the reflection path of the light emitted from the structural layer 10 are indicated by arrows.

In this embodiment, the reflective member 50 includes a reflective layer 52 that is directly disposed on the lower surface of the anti-light-disturbance layer 40. The reflective layer 52 is formed with an inclined surface 51 on the side close to the display structure layer 10. One end of the inclined surface 51 is adjacent to the pixel definition layer 30, and the other end thereof extends obliquely toward the display structure layer 10. The inclined surface 51 may be formed by reducing or thickening the thickness of the reflective layer 52, but it is not limited thereto, and the inclined surface 51 may be formed by other ways.

For example, as shown in FIG. 1, in a first direction from the cover plate to the display structure layer, a cross sectional area of the reflective layer 52 in a direction parallel with the cover plate 20 decreases gradually. Furthermore, an end (end A) of the reflective layer 52 close to the pixel definition layer 30 is closer to the cover plate 20 than an end (end B) of the reflective layer 52 away from the pixel definition layer 30.

Optionally, the material of the reflective layer 52 is Al, Mo or ITO-Ag-ITO alloy, which may play a better reflective role.

The display substrate 1 further includes a photoresist 60. The photoresist 60 is disposed below the anti-light crosstalk layer 40, and an additional reflective layer 54 covers the surface of the photoresist 60. The reflective layer 52 covers the surface of the photoresist 60. In this way, the reflective layer 52 covers the surface of the photoresist 60 to reflect the light emitted by the display structure layer 10 that was absorbed by the side surface of the photoresist 60. After the light is reflected to the display structure layer 10, the light may be reflected again to the pixel definition layer 30 through the display structure layer 10, so that the utilization efficiency of the light emitted by the display structure layer 10 may be greatly improved, thereby greatly improving the overall current efficiency.

For example, as shown in FIG. 1, an orthographic projection of an end (end C) of the additional reflective layer 54 away from the pixel definition layer 30 onto the cover plate 20 is outside an orthographic projection of the pixel definition layer 30 onto the cover plate 20.

In this embodiment, the display panel is applied to QD-OLED, and the anti-light crosstalk layer 40 is a partition wall. The sub-pixel unit of the display substrate 1 includes a green sub-pixel unit, a red sub-pixel unit, and a blue sub-pixel unit, and the pixel definition layers 30 include a green quantum dot layer 31, a red quantum dot layer 32, and a blue scattering particle layer 33. The green quantum dot layer 31, the red quantum dot layer 32, and the blue scattering particle layer 33 are spaced apart on the lower surface of the cover plate 20. The green quantum dot layer 31 corresponds to the green sub-pixel unit, the red quantum dot layer 32 corresponds to the red sub-pixel unit, and the blue scattering particle layer 33 corresponds to the blue sub-pixel unit. The color of the light emitted by the display structure layer 10 is blue. The blue light passes through through the green quantum dot layer 31 and emits green light; the blue light passes through the red quantum dot layer 32 and emits red light.

The display structure layer 10 may include, but is not limited to, stacked thin film transistors 11 and light-emitting components 12. The thin film transistor 11 includes an active layer 112, an interlayer insulating layer 113, a gate 114, a source 116, a drain 117 and a passivation layer 115. The drain 117 and the source 116 are both connected to the active layer 112. The thin film transistor 11 may further include a buffer layer 111 on the substrate 70, and other film layers of the thin film transistor 11 are provided on the buffer layer 111. The buffer layer 111 may adjust the stress, neutralize the electric charge and the like.

The light-emitting component 12 includes an anode 121, a pixel defining layer 122, a light emitting functional layer 123, and a cathode 124 that are stacked. The cathode 124 is a transparent cathode, and the anode 121 is a reflective anode. In this way, by providing the reflective anode, after the inclined surface 51 of the reflective layer 52 reflects the light to the reflective anode, the light is reflected back to the pixel definition layer 30 via the reflective anode, thereby greatly improving the utilization efficiency of the light emitted by the display structure layer 10, and greatly improving the overall current efficiency.

As shown in FIG. 1, the transparent cathode 124 is closer to the reflective layer 52 than the reflective anode 121.

The drain 117 of the thin film transistor 11 is electrically connected to the anode 121 of the light-emitting component 12. The light emitting functional layer 123 of the light-emitting component 12 includes a light emitting layer, and may further include at least one of an electron transport layer, an electron injection layer, a hole transport layer and a hole injection layer.

Based on the above, the display structure layer 10 may further include a planarization layer 13 disposed between the thin film transistor 11 and the light-emitting device 12, and the planarization layer 13 is configured to ensure the light emitted by the light-emitting device 12 to be uniform.

In this embodiment, the display substrate 1 further includes a base 70 under the display structure layer 10. The substrate 70 includes a bottom plate 71 and a light shielding layer 72 provided on the bottom plate 71.

The substrate 70 is provided with lines (not shown in the figure). Because the lines are very dense, it is easy to cause light interference, which directly affects the clarity of the imaging effect. Here, the type of wiring is not limited, and may be a gate line, a data line, a control line, and so on. By providing a light-shielding layer 72, the light-shielding layer 72 can shield the light and avoid passing through the wiring, thereby avoiding the light interference phenomenon caused by the dense wiring. When the display substrate 1 is applied to the display panel, the clarity of the display panel is improved. On this basis, the material of the light-shielding layer 72 is not limited, as long as it can block light. The material of the light shielding layer 72 may be black resin, metal, or the like. Since the thin film transistor 11 and the light-emitting component 12 provided on the substrate 70 need to undergo high temperature treatment during the manufacturing process, and the metal can withstand high temperature, the material of the light shielding layer 72 in the embodiment of the present disclosure is preferably a metal material.

In operation, part of the light emitted by the light-emitting functional layer 123 is directly converted into pixel emission through the pixel definition layer 30, and part of the light reflected by the inclined surface 51 of the reflective layer 52 is reflected to the display structure layer 10, and then reflected by the reflective anode in the display structure layer 10. After being converted into pixel light emission through the pixel definition layer 30, the other part is reflected by the reflective layer 52 on the surface of the photoresist 60 and then converted into pixel light emission through the pixel definition layer 30. According to some embodiments of the present disclosure, the light which is emitted by the display structure layer 10 and absorbed by the side surface of the photoresist 60 and the anti-light crosstalk layer 40 is effectively utilized, and the light output after conversion by the pixel definition layer 30 increases, which increases the light extraction amount of the display structure layer 10 and improves the final pixel current efficiency, reducing the current and power consumption of the display panel.

As shown in FIG. 2, by the reflective layer 52 below the anti-light crosstalk layer 40, the light emitted by the display structure layer 10 and absorbed by the anti-light crosstalk layer 40 between two adjacent pixel definition layers 30 in FIG. 2 may be reflected to the pixel definition layer 30 through the inclined surface 51 of the reflective layer 52, so that the effective light output of the pixel definition layer 30 is increased.

Specifically, in FIG. 2, along the width direction W of the pixel definition layer 30, the arrangement of the pixel definition layer 30 is: red quantum dot layer 32, blue scattering particle layer 33, green quantum dot layer 31, blue scattering particles layer 33. Along the width direction W of the pixel defining layer 30, the first region 521 of the reflective layer 52 between the adjacent red quantum dot layer 32 and the green quantum dot layer 31 may reflect the light emitted by the display structure layer 10 under it and enter the red quantum dot layer 32; the second region 522 of the reflective layer 52 between the adjacent green quantum dot layer 31 and the blue scattering particle layer 33 may reflect the light emitted by the display structure layer 10 under it and enter the green quantum dot layer 31; the third region 523 of the reflective layer 52 between the adjacent blue scattering particle layer 33 and the green quantum dot layer 31 may reflect the light emitted by the display structure layer 10 under it and enter the blue scattering particle layer 33, thereby increasing the light output of the pixel definition layer 30. At the same time, the light emitted from the display structure layer 10 on the side of the photoresist 60 will also be reflected by the reflective layer 52 and enter the adjacent pixel definition layer 30, thereby increasing the light output of the pixel definition layer 30.

In this embodiment, by the inclined surface 51 of the reflective member 50, the light emitted by the display structure layer 10 that may be absorbed by the anti-light crosstalk layer 40 may be reflected, and after reflecting the light to the display structure layer 10, the light may be reflected to the pixel definition layer 30 through the display structure layer 10, so that the utilization efficiency of the light emitted by the display structure layer 10 can be greatly improved, thereby greatly improving the overall current efficiency.

Figure 3:
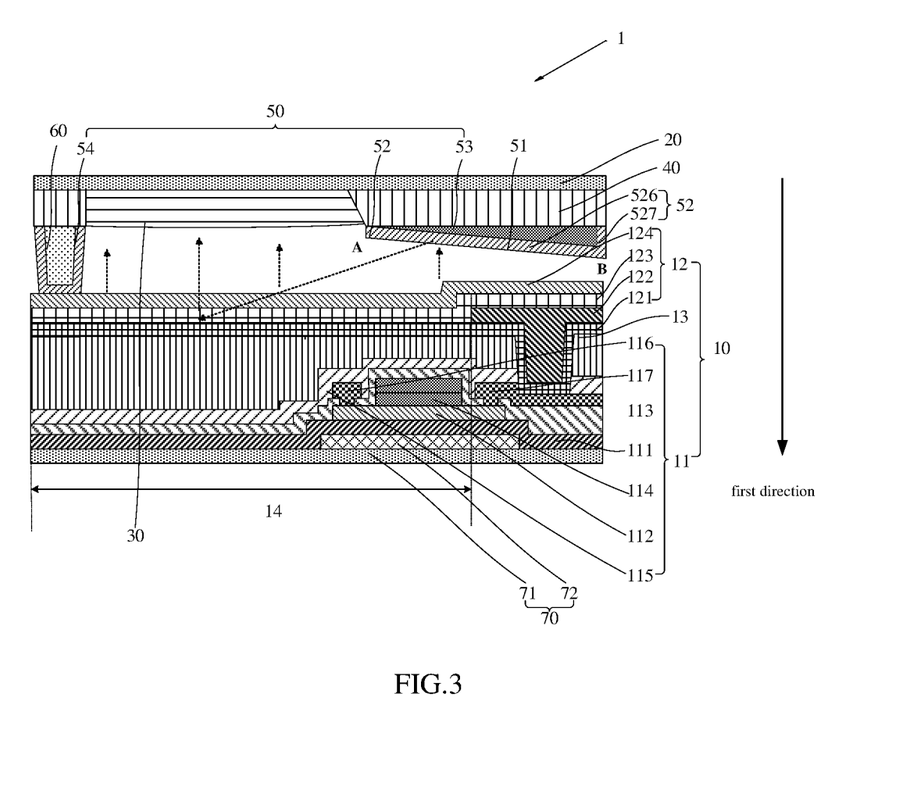
FIG. 3 is a cross-sectional view of a display substrate in some embodiments of the present disclosure.
Figure 4:
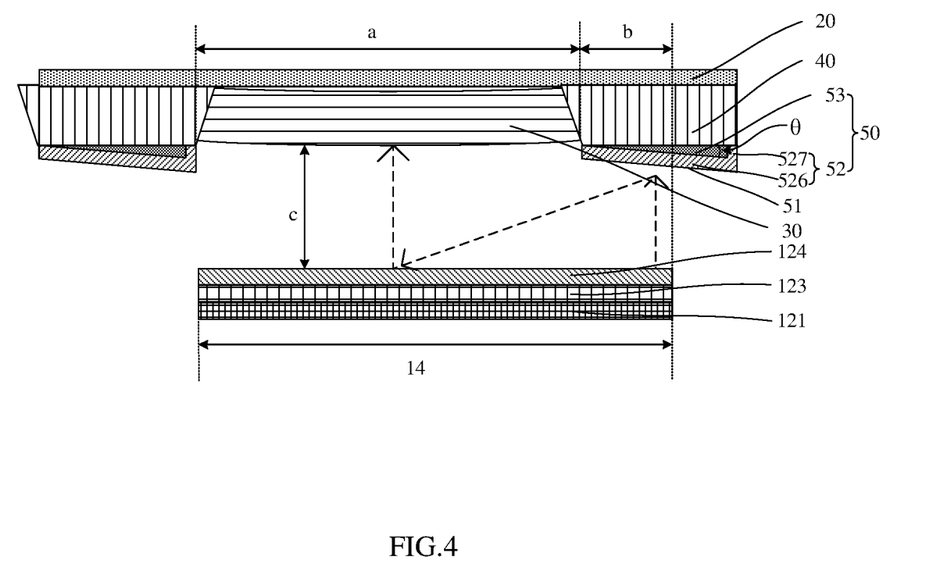
FIG. 4 is a cross-sectional view of a portion of a display substrate in some embodiments of the present disclosure; and FIG. 5(a)

Referring to FIGS. 3 and 4, the overall structure of the filtering device is basically the same as the above embodiments, the difference is that the reflective member 50 includes a reflective layer 52 and an inclined layer 53, the inclined layer 53 is located between the anti-light crosstalk layer 40 and the reflective layer 52, the thickness of the inclined layer 53 gradually increases from the end close to the display structure layer 10 to the end away from the display structure layer 10. An included angle Θ is formed between the lower surface of the inclined layer 53 and the plane of the anti-light crosstalk layer 40. The reflective layer 52 covers the lower surface of the inclined layer 53 so that a surface of the reflective layer 52 close to the display structure layer 10 forms an inclined surface 52. In this way, the reflective layer 52 is formed on the lower surface of the inclined layer 53, that is, the inclined surface of the inclined layer, so that the reflective layer 52 forms an inclined surface 52, that is, one end of the inclined surface 52 is adjacent to the pixel defining layer 30, and the other end of the inclined surface 52 extends obliquely toward the display structure layer 10. The inclined surface 52 of the reflective layer 52 can achieve a better effect of reflecting light, and since the reflectance of the two reflections is more than 98%, the utilization efficiency of the light emitted by the display structure layer 10 may be greatly improved, thereby greatly improving the overall current efficiency.

For example, as shown in FIG. 3, a cross sectional area of the reflective layer 52 in a direction parallel with the cover plate 20 decreases gradually along a first direction from the cover plate to the display structure layer. Furthermore, an end (end A) of the reflective layer 52 close to the pixel definition layer 30 is closer to the cover plate 20 than an end (end B) of the reflective layer 52 away from the pixel definition layer 30.

Specifically, the lower surface of the inclined layer 53 includes an inclined surface and a vertical surface, and the reflective layer 52 includes an inclined portion 526 and a vertical portion 527. The lower surface of the inclined portion 526 is the inclined surface 51, and the inclined portion 526 of the reflective layer 52 may reflect the light emitted by the display structure layer 10 that may be absorbed by the anti-light crosstalk layer 40. After the light is reflected to the display structure layer 10, the light is reflected again to the pixel definition layer 30 via the display structure layer 10, which may greatly improve the utilization efficiency of the light emitted by the display structure layer 10, thereby greatly improving the overall current efficiency. Similarly, the vertical portion 527 of the reflection layer 52 may also reflect the light emitted from the display structure layer 10 that may be absorbed by the anti-light crosstalk layer 40.

In this embodiment, the material of the inclined layer 53 is an organic material. Specifically, the material of the inclined layer 53 is SiOx or SiNx, but it is not limited thereto, and other organic materials may be used.

As shown in FIG. 4, the value range of the included angle θ is $c/b*[1-(a+b)/(a+2b)] < \tan\theta < 90°$ C., where the width of the pixel definition layer 30 is a, the width of the orthographic projection of the light emitting region 14 of the display structure layer 10 on the inclined layer 53 is b, and the distance between the pixel definition layer 30 and the display structure layer 10 is c.

Optionally, the optimal value of the included angle θ is $\tan\theta = 2c/b*[1-(a+b)/(a+2b)]$. When the value of the included angle θ is $\tan\theta < c/b*[1-(a+b)/(a+2b)]$, the light can still be reflected by the vertical portion 527 of the reflective layer 52, which can also increase light utilization, but not the best angle. In practical applications, the angle of the inclined layer 53 may be adjusted according to the actual situation. The principle of the adjustment is that all the light reflected by the reflective layer 52 may exit from the pixel definition layer 30 to ensure maximum light extraction.

The manufacturing process of the base 70 and the display structure layer 10 of the display substrate 1 in this embodiment is the same as that in the related art. After the anti-light crosstalk layer 40 is formed on the cover plate 20, first the inclined layer 53 and the photoresist 60 are formed, and then the reflective layer 52 is formed by depositing and patterning a highly reflective material, and then the reflective layer 52 only remains on the surfaces of the inclined layer 53 and the photoresist 60, and other positions are etched away. Next, the pixel definition layer 30 is formed at the opening of the anti-light crosstalk layer 40. Finally, a transparent filling layer covers the display structure layer 10, and the cover plate 20 is covered on the display structure layer 10. Due to the specific fluidity of the transparent filling layer, the space supported by the photoresist 60 may be filled well.

Figure 5:
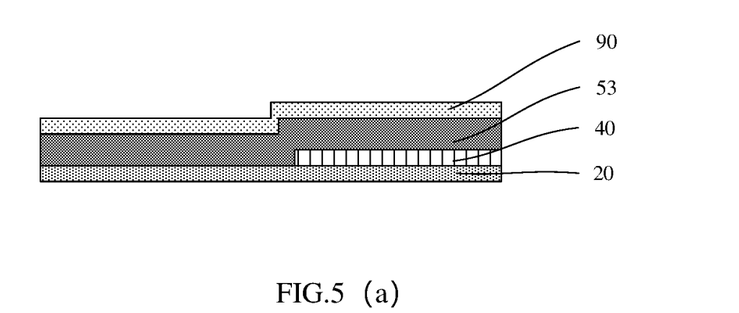

Specifically, the process flowchart of the method of forming the inclined layer 53 is shown in FIG. 5 (a)-FIG. 5 (e). An anti-light crosstalk layer 40 is formed on the cover plate 20, an inclined layer 53 is deposited on the anti-light crosstalk layer 40 and the opening of the anti-light crosstalk layer 40, and a photoresist 90 covers the inclined layer 53. The inclined layer 53 in the opening of the anti-light crosstalk layer 40 is removed by exposure and etching, and the inclined layer 53 at a reserved position is etched by thickness; then, the photoresist 90 is peeled off; finally, trimming is performed to finally form the inclined layer 53 with the inclined surface 531.

The above are only some embodiments of the present disclosure and are not intended to limit the present disclosure. Any modification, equivalent replacement, improvement, etc. made within the principle of the present disclosure should be fall within the scope of the present disclosure.

What is claimed is:

1. A display substrate, comprising: a display structure layer, a cover plate on the display structure layer and a plurality of pixel definition layers and an anti-light crosstalk layer between the display structure layer and the cover plate, wherein
   the pixel definition layers are arranged on a lower surface of the cover plate at intervals and are in a one-to-one correspondence to sub-pixel units of the display substrate, the anti-light crosstalk layer surrounds each pixel definition layer, wherein a reflective component is between the anti-light crosstalk layer and the display structure layer, the reflective component comprises an inclined surface configured to reflect light from the display structure layer to the pixel definition layer.

2. The display substrate according to claim 1, wherein the reflective component comprises a reflective layer, and the inclined surface is at a side of the reflective layer close to the display structure layer, and an end of the inclined surface is connected to the pixel definition layer, and the other end of the inclined surface extends obliquely toward the display structure layer.

3. The display substrate according to claim 1, wherein the reflective component comprises a reflective layer and an inclined layer, the inclined layer is between the anti-light crosstalk layer and the reflective layer, and a thickness of the inclined layer increases gradually from an end of the inclined layer close to the display structure layer to an end of the inclined layer away from the display structure layer, an included angle θ is formed between a lower surface of the inclined layer and a plane of the anti-light crosstalk layer;
   the reflective layer is on the lower surface of the inclined layer, to make a surface of the reflective layer close to the display structure layer to form the inclined surface.

4. The display substrate according to claim 3, wherein a value range of the included angle θ is c/b*[1−(a+b)/(a+2b)] <tan Θ<90° C., wherein a width of the pixel definition layer is a, a width of an orthographic projection of a light emitting region of the display structure layer onto the inclined layer is b, and a distance from the pixel definition layer to the display structure layer is c.

5. The display substrate according to claim 3, wherein a material of the inclined layer is an organic material.

6. The display substrate according to claim 2, further comprising a photoresist under the anti-light crosstalk layer, and an additional reflective layer covers a surface of the photoresist.

7. The display substrate according to claim 2, wherein a material of the reflective layer is Al, Mo or ITO-Ag-ITO alloy.

8. The display substrate according to claim 1, wherein the anti-light crosstalk layer is a partition wall.

9. The display substrate according to claim 1, wherein the sub-pixel units of the display substrate comprise a green sub-pixel unit, a red sub-pixel unit and a blue sub-pixel unit, and the pixel definition layers comprise a green quantum dot layer, a red quantum dot layer and a blue scattering particle layer, the green quantum dot layer, the red quantum dot layer and the blue scattering particle layer are arranged on the lower surface of the cover plate at intervals, and the green quantum dot layer corresponds to the green sub-pixel unit, the red quantum dot layer corresponds to the red sub-pixel unit, and the blue scattering particle layer corresponds to the blue sub-pixel unit.

10. The display substrate according to claim 3, further comprising a photoresist under the anti-light crosstalk layer, and an additional reflective layer covers a surface of the photoresist.

11. The display substrate according to claim 3, wherein a material of the reflective layer is Al, Mo or ITO-Ag-ITO alloy.

12. The display substrate according to claim 2, wherein a first end of the reflective layer close to the pixel definition layer is closer to the cover plate than a second end of the reflective layer away from the pixel definition layer.

13. The display substrate according to claim 12, wherein a cross sectional area of the reflective layer in a direction parallel with the cover plate decreases gradually along a direction from the cover plate to the display structure layer.

14. The display substrate according to claim 3, wherein a first end of the reflective layer close to the pixel definition layer is closer to the cover plate than a second end of the reflective layer away from the pixel definition layer.

15. The display substrate according to claim 6, wherein an orthographic projection of an end of the additional reflective layer away from the pixel definition layer onto the cover plate is outside an orthographic projection of the pixel definition layer onto the cover plate.

16. The display substrate according to claim 1, wherein the display structure layer comprises a light-emitting component, the light-emitting component comprises a reflective electrode configured to reflect, to the pixel definition layer, light which is from the display structure layer and reflected by the inclined surface.

17. The display substrate according to claim 16, wherein the display structure layer further comprises a transparent electrode closer to the reflective layer than the reflective electrode.

18. The display substrate according to claim 17, further comprising a base at a side of the display structure layer away from the cover plate, and the display structure layer further comprises a thin film transistor;
    a light-shielding layer is at a side of the base close to the cover plate, and a position of the light-shielding layer corresponds to a position of the thin film transistor.

19. A display panel comprising a display substrate according to claim 1.

* * * * *